United States Patent [19]

Pricer

[11] 4,080,590
[45] Mar. 21, 1978

[54] CAPACITOR STORAGE MEMORY
[75] Inventor: Wilbur David Pricer, Burlington, Vt.
[73] Assignee: International Business Machines Corporation, Armonk, N.Y.
[21] Appl. No.: 672,197
[22] Filed: Mar. 31, 1976
[51] Int. Cl.$^2$ .................. G11C 11/24; H01L 11/00
[52] U.S. Cl. ........................ 365/149; 357/24; 365/183
[58] Field of Search .......... 340/173 CA, 173 R; 357/24

[56] References Cited

U.S. PATENT DOCUMENTS

| | | | |
|---|---|---|---|
| 3,852,800 | 12/1974 | Ohwadz et al. | 340/173 CA |
| 3,931,465 | 1/1976 | Levine | 357/24 |
| 3,986,180 | 10/1976 | Cade | 340/173 R |
| 3,987,474 | 10/1976 | Walker | 340/173 CA |

Primary Examiner—Vincent P. Caney

[57] ABSTRACT

A semiconductor memory produced in a unipolar technology includes a cell which has an inversion capacitor with one terminal connected to a bit/sense line, the other terminal is coupled to a source of charges by a pulse from a word line. To provide a word organized array of these cells, each word includes a source of charges produced at the surface of a semiconductor substrate and plurality of inversion capacitors are formed also at the surface of the semiconductor in spaced apart relationship from the charge source. Information is written into the capacitors by applying voltages of two different magnitudes, representing 1 and 0 bits of information, to one terminal of the capacitors while a word pulse produces inversion layers at the surface of the substrate between the capacitors to interconnect serially the charge source with each of the capacitors. The capacitors having the larger voltage store the greater amount of charge. This charge can then be detected by measuring the voltage across the storage capacitors when a work pulse again connects the charge source with each of the capacitors.

17 Claims, 6 Drawing Figures

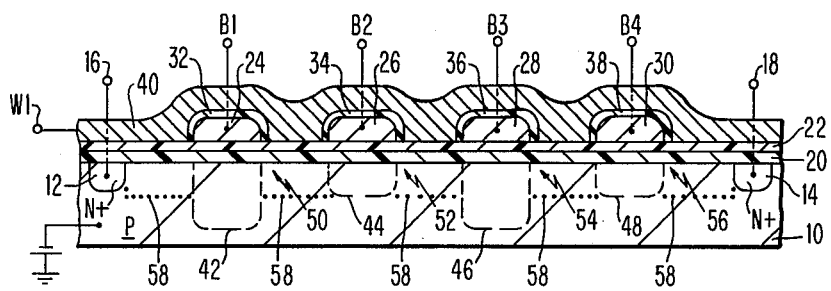
FIG. 1
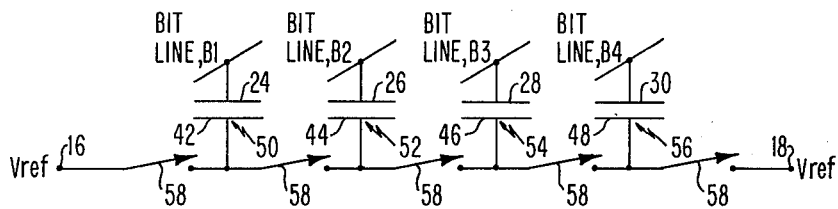
FIG. 2
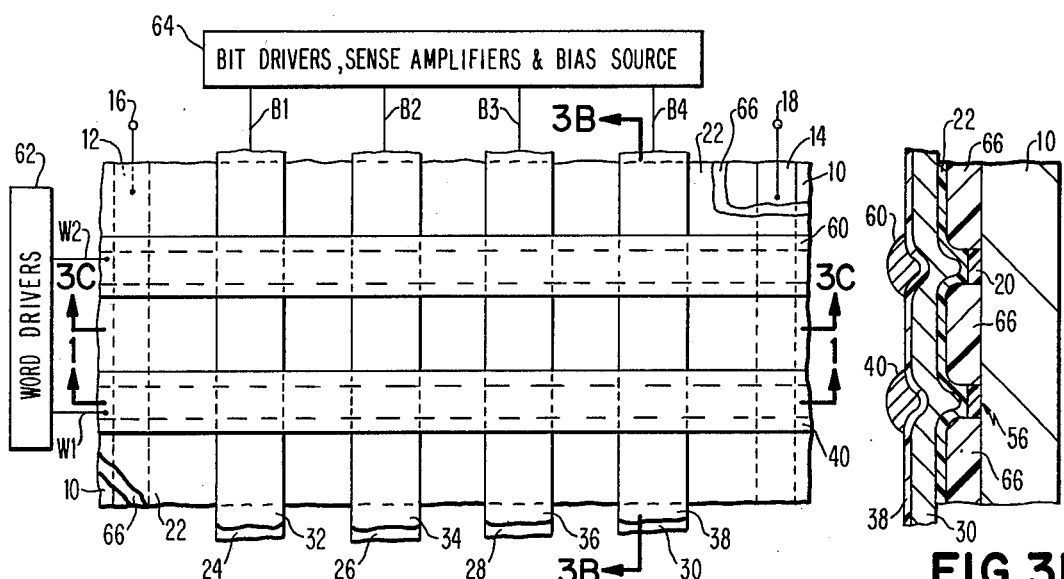
FIG. 3A
FIG. 3B
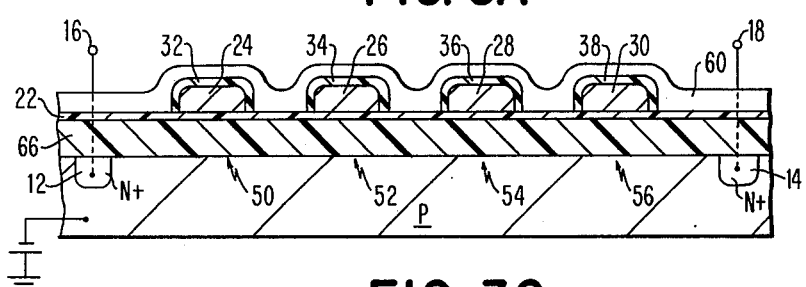
FIG. 3C
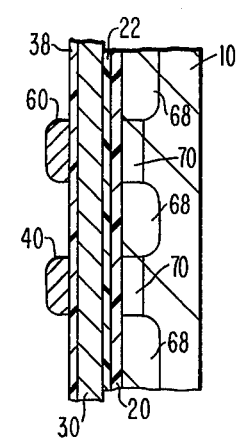
FIG. 4

CAPACITOR STORAGE MEMORY

BACKGROUND OF THE INVENTION

1. Field of the Invention

This invention relates to integrated semiconductor memory circuits and more particularly to memory circuits which employ a capacitor for storing binary digits of information.

2. Description of the Prior Art

Integrated semiconductor memory circuits, particularly those employing cells which include essentially a storage capacitor and a switch, have achieved high memory cell densities. One of the simplest circuits for providing small memory cells is described in commonly assigned U.S. Pat. No. 3,387,286, filed July 14, 1967, by R. H. Dennard. Each of these cells employs a storage capacitor and a field effect transistor acting as a switch to selectively connect the capacitor to a bit/sense line. In also commonly assigned U.S. Pat. Nos. 3,811,076, by W. M. Smith, and 3,841,926 by R. H. Garnache and W. M. Smith, both filed Jan. 2, 1973, there is disclosed a one device field effect transistor memory cell of the type described in the above identified Dennard patent which is made to a small size by utilizing a layer of doped polycrystalline silicon separated by a dielectric medium disposed on the surface of a semiconductor substrate for forming a storage capacitor. These latter two patents also teach a process which uses very effectively a dual insulation layer of silicon dioxide and silicon nitride.

In commonly assigned copending application having Ser. No. 587,528, filed on June 16, 1975, by W. D. Pricer and J. E. Selleck, now U.S. Pat. No. 3,979,734, there is described a memory array made of small cells which employ storage capacitors and bipolar transistors. In this latter array, which is word organized, each storage capacitor of these cells has simply one capacitor terminal connected to a separate bit/sense line while selected cells forming a word are simultaneously accessed by utilizing a word pulse for coupling to the other terminal of the storage capacitors of that word. By simultaneously accessing the other terminal of all storage capacitors of a particular word, isolation between cells of the word is not required.

SUMMARY OF THE INVENTION

It is an object of this invention to provide an improved memory cell having a very small area which utilizes a single storage capacitor and a simplified switch.

It is another object of this invention to provide an improved memory array which has very high density.

It is still another object of this invention to provide a very high density memory array which is simple and inexpensive to fabricate.

Yet a further object of this invention is to provide an improved memory array wherein the size of each cell of the array is only four times the area of the intersection of a word line and a bit/sense line.

A further object of this invention is to provide an improved word organized memory array which is accessed by a very simple switching arrangement employing a unipolar technology.

Still another object of this invention is to provide an improved high density memory array having cells organized as a plurality of words with the cells including substantially only storage capacitors formed at the surface of a semiconductor substrate with no isolation required in the substrate between cells of each word.

In accordance with the teaching of this invention, a memory cell is produced in a semiconductor substrate having a given conductivity type by providing a source of charges at the surface of the substrate and first and second conductive plates with a dielectric medium disposed between the substrate and the plates. A word line is connected to the first plate and a bit line is connected to the second plate. Voltages on the word and bit lines produce inversion layers at the substrate surface to form, with the plates, inversion capacitors. The first and second plates are arranged so that a continuous inversion layer is formed from the charge source to one of the inversion capacitors through the inversion layer of the other capacitor. Information is stored in the cell by storing predetermined amounts of charges, preferably electrons, from the charge source into depletion wells produced by the voltage on the bit line.

In accordance with the teachings of a further aspect of this invention, an integrated circuit semiconductor memory array produced by a unipolar technology, is provided with very small cells, each of which includes substantially only a storage capacitor having a bit/sense line connected to one terminal of the capacitor and a word line providing a coupling to the other terminal of the capacitor. In an embodiment of this invention, a source of charges is produced at the surface of a semiconductor substrate and a plurality of inversion capacitors are formed also at the surface of the semiconductor substrate in a spaced apart relationship from the charge source. Information is written into the capacitors by applying binary voltage pulses to one terminal of the capacitors while a word pulse produces inversion layers at the surface of the substrate to interconnect in a serial arrangement the charge source with each of the capacitors. The binary voltage pulses have different magnitudes for representing a 0 and a 1 bit of information. The different voltage magnitudes produce depletion wells in the substrate of corresponding depth. When a word pulse connects the capacitors to the charge source the deeper wells store more charge which then can be detected by determining the charge across the inversion capacitors when a word pulse again connects the charge source with each of the capacitors and the bit/sense lines are held at substantially equal potentials.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIG. 1 is a sectional view of an embodiment of a semiconductor memory array of the present invention, FIG. 2 is a simplified electrical schematic diagram of the memory array illustrated in FIG. 1, FIG. 3A is a plan view of the memory array illustrated in FIG. 1 showing cells coupled to two word lines, FIG. 3B is a section taken through FIG. 3A at 3B—3B, FIG. 3C is a section taken through FIG. 3A at 3C—3C, and FIG. 4 is a section similar to that illustrated in FIG. 3B but of another embodiment of the semiconductor memory array of the present invention.

DESCRIPTION OF THE PREFERRED EMBODIMENTS

Referring to FIG. 1, in more detail, there is shown a section of the memory array of the invention which includes a semiconductor substrate 10 having disposed therein diffusion regions 12 and 14. The substrate 10 may be of p type conductivity, typically boron doped, with the diffusion regions 12 and 14 of n+ type, typically phosphorous or arsenic doped. Terminals 16 and 18 are connected to diffusion regions 12 and 14, respectively, to provide appropriate bias voltages for producing a source of charges. Disposed on the surface of the semiconductor substrate 10 is a first insulation layer 20 which is preferably made of silicon dioxide. A second insulation layer 22, preferably made of silicon nitride, is formed over the first insulation layer 20. The thickness of the silicon dioxide layer 20 may be, for example, 500 angstroms and the thickness of the silicon nitride layer 22 may be, for example, 200 angstroms. A plurality of conductive lines 24, 26, 28 and 30, arranged parallel to each other, are disposed over the insulating layers 20 and 22 between the diffusion regions 12 and 14. The conductive lines 24, 26, 28 and 30, preferably made of doped polycrystalline silicon, are covered with insulating layers of oxidized polycrystalline silicon 32, 34, 36 and 38, respectively. A metal line 40 is disposed over the conductive lines 24, 26, 28 and 30 in a direction orthogonal to the direction of the conductive lines 24, 26, 28 and 30. The conductive lines and the metal line are insulated from each other by the insulating layers 32, 34, 36 and 38. The conductive lines 24, 26, 28 and 30 are portions of bit/sense lines B1, B2, B3 and B4, and the metal line 40 is a portion of a word line W1.

In the operation of the array illustrated in FIG. 1 a suitable voltage is applied to the terminals 16 and 18 for providing a source of charges, preferably electrons, from diffusion regions 12 and 14. Voltages representing binary digits are applied to bit/sense lines B1, B2, B3 and B4. The voltages applied to these bit/sense lines produce depletion wells in the semiconductor substrate 10, as indicated by dashed lines 42, 44, 46 and 48. The depth of each of these depletion wells depends upon the magnitude of the voltage applied to the respective conductive lines 24, 26, 28 and 30. These conductive lines 24, 26, 28 and 30 along with the depletion wells and the dual insulating layers 20 and 22 form storage capacitors 50, 52, 54 and 56 of a word line W1 defined by metal line 40. It can be seen in FIG. 1 that the depletion wells 42 and 46 associated with storage capacitors 50 and 54 are deeper than the potential wells 44 and 48 associated with capacitors 52 and 56, respectively. In the array illustrated in FIG. 1 it will be assumed that the deeper potential wells 42 and 46 are to represent a 1 bit of binary information whereas the shallower wells 44 and 48 are to represent a 0 bit of binary information. In order to store information in capacitors 50, 52, 54 and 56 it is necessary to introduce charges into the potential wells of these capacitors from the diffusion regions 12 and 14. To introduce charges from charge sources 12 and 14 into the depletion wells 42, 44, 46, and 48, a conductive path is selectively produced between the sources 12 and 14 and each of the depletion wells 42, 44, 46 and 48. This path is produced by creating additional depletion regions 58 at the surface of the semiconductor substrate 10 between the diffusion regions 12 and 14 and the depletion regions 42 and 48, respectively, and also between the depletion regions 42 and 44, 44 and 46, and 46 and 48. These depletion regions 58 are produced by a word pulse having a positive polarity applied to the word line W1. As is known, the charges flow from the diffusion regions 12 and 14 through depletion regions 58 into potential wells that are at a potential initially more positive than the potential applied to terminals 16 and 18 to form an inversion layer at the surface of the substrate 10. After depletion wells 42, 44, 46 and 48 are filled with the charges the word pulse is terminated and the depletion regions 42, 44, 46 and 48, now forming inversion layers, are isolated from the charge sources 12 and 14 and from each other. The voltage on the bit lines B1, B2, B3 and B4 representing the binary information is turned off after the word line pulse has terminated and puddles or packets of charge of two different magnitudes remain in substrate 10 to represent the stored binary digits. In a preferred array of this invention, a rest potential of about +5 volts is supplied to all bit lines at all times. Depending on the data to be written into storage capacitors 50, 52, 54 and 56 for storing a given word, selected bit lines B1, B2, B3 and B4 have their voltages raised from +5 volts to +10 volts and a word pulse of about +5 volts is applied to word line W1. To read the information stored in capacitors 50, 52, 54 and 56, the word line W1 is pulsed again to +5 volts, with the bit lines remaining at the rest potential, to connect all capacitors to the reference voltage at the terminals 16 and 18. The bit lines which had been at +10 volts while writing, that is, those storing a 1 bit of information, will experience a relatively strong positive discharge signal while the other bit lines representing a 0 bit of information will receive substantially a signal of zero magnitude. In the alternative, if desired, the rest potential on the bit lines may be +10 volts while the bit drive voltage may be lowered to +5 volts when storing information in, for example, the storage capacitors which are to store 0 bits of binary information.

In order to more clearly understand the invention, there is shown in FIG. 2 a simplified electrical schematic diagram of the memory array illustrated in FIG. 1 wherein common reference numerals refer to like elements. The principle elements of the array illustrated in FIG. 1 are shown in FIG. 2 as being the bit lines B1, B2, B3 and B4 connected to plates 24, 26, 28 and 30, respectively. These plates 24, 26, 28 and 30 along with plates 42, 44, 46 and 48, identified as depletion regions or inversion layers in connection with FIG. 1, provide the storage capacitors 50, 52, 54 and 56, respectively. The plates 42, 44, 46 and 48 are connected to a reference potential Vref through switches 58, indicated also as depletion region or inversion layers in connection with FIG. 1, when the word pulse is applied to the word line W1 of FIG. 1 to operate the switches 58 simultaneously. The switches 58 operate simultaneously since the word line W1 which includes metal line 40, as can be seen in FIG. 1, is in intimate contact with the silicon nitride layer 22 in the areas between the capacitors 50, 52, 54 and 56 and between the capacitors 50 and 56 and the diffusion regions 12 and 14, respectively, to produce the interconnecting depletion regions 58. It can be seen that by applying voltages of greater magnitude to, say, bit lines B1 and B3 when the switches 58 are closed, a larger charge is stored in capacitors 50 and 54 than is stored in capacitors 52 and 56. The difference in voltage in these capacitors then can be readily detected by known voltage measuring techniques. In FIG. 3A there is provided a plan view of a memory array showing two word lines W1 and W2. Word line W1 is the same word line illustrated in section in FIG. 1. The section shown in FIG. 1 is indicated in FIG. 3A as being taken through FIG. 3A at 1—1. The word line W2 is similar to word line W1 and has as a portion thereof another metal line 60 which is similar to metal line 40 of word line W1. The word lines W1 and W2 are connected to a word driver 62 which produces the necessary word pulses for word lines W1 and W2. The word lines W1 and W2 share the bit lines B1, B2, B3 and B4 which are connected to unit 64. Unit 64 includes any suitable bit drivers, sense amplifiers, and a bias source. At appropriate times the unit 64 produces bit pulses for writing information into the storage capacitors 50, 52, 54 and 56 in cooperation with a pulse on selected one of word lines W1 and W2. When reading information from the storage capacitors 50, 52, 54 and 56, the bit drivers are disconnected from the bit lines B1, B2, B3 and B4 and sense amplifiers are connected to these bit lines, as is well known in the art. Since the bit lines including conductive lines 24, 26, 28 and 30 preferably have a rest potential of approximately +5 volts, the unit 64 may be utilized to provide the +5 volt bias voltage for these conductive lines. Although the capacitors 50, 52, 54 and 56 along a word line do not require isolation from each other, the capacitors associated with one of the word lines W1 and W2 must be isolated from the capacitors of the other of the word lines W1 and W2. Accordingly, as indicated in FIGS. 3A, 3B, which is a sectional view taken through FIG. 3A along lines 3B—3B, and FIG. 3C, which is a sectional view taken through FIG. 3A at 3C—3C, thick oxide strips 66 are provided to isolate the word lines from each other. It can be understood that the memory array illustrated in FIGS. 3A, 3B and 3C, having two word lines W1 and W2, operates in the same manner as does the array illustrated in FIG. 1 of the drawing except that it should be further understood that the word driver 62 is responsive to known circuitry, not shown, which selects only one word line at a time. Consequently, either the word line W1 associated with storage capacitors 50, 52, 54 and 56 is selected, or word line W2 associated with storage capacitors similar to capacitors 50, 52, 54 and 56 is selected. The storage capacitors associated with word line W2 are located at the intersection of the conductive lines 24, 26, 28 and 30 and the metal line 60 of word line W2. When operating the memory array of this invention with two or more word lines, the voltage applied to the diffusion regions 12 and 14 must have a value such that there will be little or no disturbance in the storage cells of the word lines which are not selected.

It should be noted that the voltage applied to the terminals 16 and 18 for introducing charges into substrate 10 for the potential wells 42, 44, 46 and 48 should have a magnitude such that the n+ diffusion regions 12 and 14 produce a sufficient supply of electrons to fill the wells in a short period of time. An example of suitable voltage magnitudes and polarities for the array illustrated in FIGS. 3A, 3B and 3C is −3.0 volts applied to substrate 10 and approximately +3.5 to +4.0 volts applied to each of the terminals 16 and 18 when the voltage applied to the word line is 0 to +5 volts and the voltage applied to the bit lines is between +5 and +10 volts. It should also be noted that since this memory array utilizes dynamic cells they must be refreshed within predetermined time intervals in order to prevent the loss of stored information. Any known suitable refreshing technique may be employed.

In FIG. 4 there is shown a section similar to that illustrated in FIG. 3B but of another embodiment of the semiconductor memory array of the present invention. A number of the elements shown in FIG. 4 are similar to those illustrated in FIG. 3, with like reference numerals representing the same elements. However, the embodiment in FIG. 4 differs from that illustrated in FIG. 3B in that the thick oxide 66 shown in FIGS. 3A, 3B and 3C has been removed and an ion implanted channel stop 68 is provided between and outside of the word lines indicated by conductive lines 40 and 60. The implanted channel stop 68, which may be produced by the introduction of boron into the substrate 10, as is known, provides the isolation between word lines W1 and W2 which was provided in FIG. 3B by the thick oxide 66. The embodiment of FIG. 4 also differs from that illustrated in FIG. 2B in that the embodiment of FIG. 4 includes diffusion regions 70 forming with the conductive lines 24, 26, 28 and 30 the storage capacitors for the array. Phosphorous or arsenic doping may be used to form the diffusion regions 70 under the conductive lines 24, 26, 28 and 30 where they intersect with the metal lines 40 and 60. The embodiment of the memory array illustrated in FIG. 4 operates in the same manner as does the embodiment illustrated in FIG. 3B except that the rest potential of, say +5 volts, is not required on the conductive lines 24, 26, 28 and 30, and the binary digits may be simply represented by 0 and +5 volts for 0 and 1 bits of information, due to the use of diffusion regions 70. An important aspect of the embodiment illustrated in FIG. 4 is that the array is made in a more planer fashion, with the exception of the metal lines 40 and 60, In fabricating this embodiment, the channel stops 68 may be formed by ion implantation after metal lines 40 and 60 have been formed in order to accurately align the channel stops 68 in the substrate 10.

The memory array, illustrated in FIGS. 3A, 3B amd 3C, is fabricated in a manner similar to the fabrication of charge coupled devices which are disclosed in, for example, commonly assigned U.S. Pat. No. 3,819,959 by Joseph J. Chang and John W. Sumilas. After the diffused reference voltage lines indicated in the figures as diffusion regions 12 and 14 have been formed, thick oxide 66 or, if desired, oxide/aluminum is grown over the surface of the substrate 10. A line is etched in the thick oxide 66 and thin oxide 20 is grown in the etched line. A thin layer of nitride 22 is then deposited over the entire surface. Doped polycrystalline silicon is thereafter deposited and etched to form the conductive lines 24, 26, 28 and 30. The storage capacitors or nodes are defined by the intersection of the doped polycrystalline silicon lines and the strip of thin oxide 20. The switch for connecting the potential wells to the charge sources 12 and 14 is defined by the gap between adjacent polycrystalline silicon lines 24, 26, 28 and 30 along the thin oxide. It should be noted that this fabrication process is very simple and requires only two masks, which masks, even if poorly registered, define the cell areas of the array.

It can be seen that in accordance with this invention a very dense and simply fabricated memory array has been produced, as can be noted more particularly from the plan view illustrated in FIG. 3A. The size of each cell is equal to only approximately four times the area of the intersection of the word line W1 or W2 and more particularly the thin oxide or silicon dioxide layer 20 with one of the bit or conductive lines 24, 26, 28 and 30.

It can also be seen that in accordance with the invention, the metal lines 40 and 60 may be, if desired, doped polycrystalline silicon lines similar to the conductive lines 24, 26, 28 and 30. Furthermore, the conductive lines 24, 26, 28 and 30 may be conductive metal lines, such as aluminum lines. When desired, the dual layers 20 and 22 disposed on substrate 10 between the strips of thick oxide 66 of FIGS. 3A, 3B and 3C may be replaced with a single insulation layer made of any known dielectric material, such as silicon dioxide. Also, under some circumstances when it may be desired to provide $n+$ diffusions beneath the conductive lines 24, 26, 28 and 30 so as to eliminate the need to maintain a rest potential of 5 volts on the bit lines it may also be desired to use the strips of thick oxide 66 for providing the necessary isolation between word lines.

While the invention has been particularly shown and described with reference to preferred embodiments thereof, it will be understood by those skilled in the art that various changes in form and details may be made therein without departing from the spirit and scope of the invention.

What is claimed is:

1. A capacitor memory comprising,
a semiconductor substrate,
a dielectric medium disposed on said substrate,
conductive means disposed on said dielectric medium defining a storage node at a given region on the surface of said substrate,
means for applying data signals to said conductive means,
a source of reference potential disposed on said surface of said substrate a given distance from said given region, and
means for selectively coupling said source of reference potential to said given region.

2. A capacitor memory as set forth in claim 1 wherein said conductive means forms an inversion capacitor having an inversion layer and said selectively coupling means couples said source to said inversion layer.

3. A capacitor memory as set forth in claim 1 wherein said selectively coupling means includes a conductive medium having a word pulse applied thereto.

4. A capacitor memory as set forth in claim 3 wherein said conductive means and said selectively coupling means each include an inversion capacitor.

5. A capacitor memory as set forth in claim 4 wherein the inversion capacitor of said selectivity coupling means forms a conductive path between said source of reference potential and the inversion capacitor of said conductive means.

6. A capacitor memory comprising,
a semiconductor substrate having a first type conductivity and a given region therein having a conductivity opposite to that of said first type conductivity,
means for applying a reference voltage to said given region for producing a source of charges,
an insulating medium disposed on said substrate,
a first conductive medium disposed on a first area of said insulating medium,
a second conductive medium disposed on a second area of said insulating medium, said second area being interposed between said first area and said given region,
means for applying data voltage signals to said first conductive means for forming a depletion region in said substrate, and
means for selectively applying a control voltage pulse to said second conductive medium for coupling said source of charges to said depletion region.

7. A capacitor memory comprising,
first and second capacitors, each having first and second electrodes,
first and second switches,
a source of reference potential,
means for selectively interconnecting the first electrodes of said first and second capacitors through said first switch and said first electrode of said second capacitor through said second switch to said source of reference potential, and
first and second means coupled to the second electrodes of said first and second capacitors, respectively, for applying data pulses to said capacitors.

8. A capacitor memory comprising,
a semiconductor substrate having a first type conductivity and a given region therein having a conductivity opposite to that of said first type conductivity,
means for applying a reference voltage to said given region for producing a source of charges,
an insulating medium disposed on said substrate,
a plurality of spaced apart conductive lines disposed on said insulating medium,
a conductive control line arranged on said insulating medium and substantially orthogonal to and over said plurality of conductive lines, said control line extending from said source of charges to each of said spaced apart conductive lines,
means for applying data voltage pulses to said plurality of spaced apart lines, and
means for applying a control voltage pulse to said control line to couple said source of charges to each of said spaced apart conductive lines.

9. A capacitor memory as set forth in claim 8 wherein said data voltage pulse applying means includes means for applying a bias voltage and voltages representative of binary digits to said spaced apart lines for accumulating in said substrate at said spaced apart lines predetermined amounts of charge.

10. A capacitor memory as set forth in claim 9 further including means for determining the amounts of charge accumulated at each of said spaced apart lines.

11. A capacitor as set forth in claim 10 wherein said insulation medium is a dual layer of insulation including a silicon dioxide layer and a silicon nitride layer, wherein said plurality of spaced apart conductive lines are made of doped polycrystalline silicon and said control line is made of aluminum.

12. A capacitor memory comprising,
a semiconductor substrate having a $p$-type conductivity and a given region therein having an $n+$ conductivity,
means for forming a plurality of spaced apart inversion capacitors, each having first and second terminals,
means for producing a source of charges in said given region,
means for applying voltages representative of data to the first terminal of said capacitors, and
means for applying charge from said charge source producing means to the second terminal of each of said inversion capacitors.

13. A capacitor memory as set forth in claim 12 wherein said inversion capacitors are aligned and said charge passes through at least one of said second terminals before being applied to another terminal of said inversion capacitors.

14. A capacitor memory as set forth in claim 13 wherein each of said first terminals is a conductive line and each of said second terminals is an inversion layer in said substrate.

15. A capacitor memory comprising,
a semiconductor substrate having a first type conductivity and a given plurality of spaced apart regions disposed at the surface thereof having a conductivity opposite to that of said first type conductivity,
a source of reference potential disposed on the surface of said substrate spaced from said plurality of regions,
an insulating medium disposed on said substrate,
a given plurality of conductive lines disposed on said insulating medium over said given plurality of spaced apart regions,
a conductive control line arranged on said insulating medium and substantially orthogonal to and over said plurality of conductive lines, said control line extending from said source to each of said spaced apart conductive lines,
means for applying data voltage pulses to said plurality of spaced apart conductive lines, and
means for applying a control voltage pulse to said control line to couple said source to each of said plurality of spaced apart regions.

16. A capacitor memory as set forth in claim 15 wherein plurality of spaced apart regions are diffusion regions.

17. A method of making a capacitor memory which comprises,
forming a thin dielectric strip on a semiconductor substrate,
disposing a plurality of spaced apart conductive lines over said strip in a direction orthogonal to said strip,
providing a source of charges, and
forming a control line in contact with said thin strip between said conductive lines extending from said charge source to each of said conductive lines.

* * * * *